United States Patent
Hayashi et al.

(10) Patent No.: US 12,132,083 B2
(45) Date of Patent: Oct. 29, 2024

(54) SILICON CARBIDE SEMICONDUCTOR DEVICE

(71) Applicant: FUJI ELECTRIC CO., LTD., Kawasaki (JP)

(72) Inventors: Shingo Hayashi, Matsumoto (JP); Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 396 days.

(21) Appl. No.: 17/706,301

(22) Filed: Mar. 28, 2022

(65) Prior Publication Data

US 2022/0376054 A1    Nov. 24, 2022

(30) Foreign Application Priority Data

May 24, 2021   (JP) ................................. 2021-087221

(51) Int. Cl.
*H01L 29/16*   (2006.01)

(52) U.S. Cl.
CPC .............................. *H01L 29/1608* (2013.01)

(58) Field of Classification Search
None
See application file for complete search history.

(56) References Cited

U.S. PATENT DOCUMENTS

| | | | | |
|---|---|---|---|---|
| 2006/0097267 | A1* | 5/2006 | Kumar | H01L 29/7813 257/77 |
| 2017/0338336 | A1* | 11/2017 | Nasu | H01L 29/16 |
| 2020/0083338 | A1 | 3/2020 | Kinoshita | |
| 2020/0294989 | A1 | 9/2020 | Okumura | |

FOREIGN PATENT DOCUMENTS

| | | |
|---|---|---|
| JP | 2020-043241 A | 3/2020 |
| JP | 2020-150179 A | 9/2020 |

* cited by examiner

*Primary Examiner* — Asok K Sarkar
(74) *Attorney, Agent, or Firm* — Rabin & Berdo, P.C.

(57) ABSTRACT

A silicon carbide semiconductor device has a silicon carbide semiconductor substrate of a first conductivity type, a first semiconductor layer of the first conductivity type, a second semiconductor layer of a second conductivity type, first semiconductor regions of the first conductivity type, second semiconductor regions of the second conductivity type, a gate insulating film, gate electrodes, first electrodes, a second electrode, and a gate pad portion configured by a gate electrode pad and a connecting portion. The second semiconductor layer includes a first region facing the connecting portion and a second region facing a corner portion of the gate electrode pad, and the first and second regions are free of the second semiconductor regions. The oxide film is provided on surfaces of the second semiconductor regions and the first and second regions, and the oxide film and the gate insulating film are made of a same material.

7 Claims, 9 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2021-087221, filed on May 24, 2021, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, silicon (Si) is used as a constituent material of power semiconductor devices for controlling high voltage and/or large current. There are several types of power semiconductor devices such as bipolar transistors, insulated gate bipolar transistors (IGBTs), and metal oxide semiconductor field effect transistors (MOSFETs) that have insulated gates (MOS gates) having a 3-layer structure including a metal, an oxide film, and a semiconductor; these devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs and are difficult to adapt for large current but can be switched at high speeds up to about several MHz.

There is a strong demand in the market for large-current, high-speed power semiconductor devices and thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide band gap of 3 eV, and may be used very stably as a semiconductor even at high temperatures. Further, SiC has a critical electric field strength that is at least ten times that of silicon. SiC has great potential to exceed the material limits of silicon and therefore, further growth is expected in power semiconductor applications, especially for MOSFETs. In particular, the on-resistance thereof is expected to be small. Vertical SiC-MOSFETs having lower on-resistance while maintaining high breakdown voltage characteristics can be expected.

Here, FIG. 9 is a top view of a gate pad portion of a conventional silicon carbide semiconductor device. As the conventional silicon carbide semiconductor device, a vertical SiC-MOSFET is described as an example. In the vertical SiC-MOSFET, at a front surface thereof, a gate pad portion 123 and a source pad portion are provided. The source pad portion is provided in a periphery of the gate pad portion 123. The gate pad portion 123 is configured by a gate electrode pad 119 connected to gate electrodes, and a connecting portion 119a connecting the gate electrode pad 119 and a gate runner. FIG. 10 is a cross-sectional view of a portion E-E' of the conventional silicon carbide semiconductor device depicted in FIG. 9. FIG. 11 is a cross-sectional view of a portion F-F' of the conventional silicon carbide semiconductor device depicted in FIG. 9.

In the gate pad portion 123 of the conventional vertical SiC-MOSFET, on a front surface of an $n^+$-type silicon carbide substrate, an $n^-$-type silicon carbide layer 102 and an n-type region (not depicted) are deposited, a lower $p^+$-type base region 103a and an upper $p^+$-type base region 103b are selectively provided in the n-type region, and a p-type base layer 106 is provided on the n-type region. Further, a $p^{++}$-type contact region 108 is selectively provided at the surface of the p-type base layer 106.

Further, to enhance electrostatic discharge (ESD) capability at the gate pad portion 123 of the vertical SiC-MOSFET, a field oxide film 121 having a thickness of about 500 nm is provided in an edge termination region for mitigating electric field and sustaining breakdown voltage. On the field oxide film 121, a high temperature oxide (HTO) film 116 having a thickness of about 100 nm is provided.

A polysilicon 117 is provided on the HTO film 116, an interlayer insulating film 118 constituted by BPSG and NSG is provided on the polysilicon 117, and a metal film 124 is provided on the interlayer insulating film 118. A contact hole 122a that reaches the HTO film 116 is opened in the polysilicon 117 and the interlayer insulating film 118 is embedded in the contact hole 122a. A portion of the polysilicon 117 in the gate pad portion 123 is insulated from a portion of the polysilicon 117 in the source pad portion by the interlayer insulating film 118.

Further, a contact hole 122b that reaches the polysilicon 117 is opened in the interlayer insulating film 118, whereby the metal film 124 and the polysilicon 117 are electrically connected. A contact hole 122c that reaches the interlayer insulating film 118 is opened in the metal film 124, whereby a portion of the metal film 124 in the gate pad portion 123 is electrically insulated from a portion thereof in the source pad portion. The portion of the metal film 124 in the gate pad portion 123 constitutes the gate electrode pad 119.

Further, a technique has been disclosed in which the surface area of an entire area of a gate polysilicon layer provided on a first main surface of a semiconductor substrate via an oxide film is increased, whereby even when a large amount of charge is injected into the gate pad such as due to ESD, voltage applied to the oxide film beneath the gate polysilicon layer may be distributed and dielectric breakdown of the oxide film may be suppressed (for example, refer to Japanese Laid-Open Patent Publication No. 2020-150179).

SUMMARY OF THE INVENTION

According to an embodiment of the invention, a silicon carbide semiconductor device includes a silicon carbide semiconductor substrate of a first conductivity type, having a first main surface and a second main surface opposite to each other; a first semiconductor layer of the first conductivity type, provided on the first main surface of the silicon carbide semiconductor substrate, the first semiconductor layer having an impurity concentration lower than an impurity concentration of the silicon carbide semiconductor substrate and a first surface and a second surface opposite to each other, the second surface facing the silicon carbide semiconductor substrate; a second semiconductor layer of a second conductivity type, selectively provided in the first semiconductor layer, at the first surface of the first semiconductor layer, the second semiconductor layer having a first surface and a second surface opposite to each other, the second surface facing the silicon carbide semiconductor substrate; a plurality of first semiconductor regions of the first conductivity type, selectively provided in the second semiconductor layer, at the first surface of the second semiconductor layer; a plurality of second semiconductor regions of the second conductivity type, selectively provided in the second semiconductor layer, at the first surface of the second semiconductor layer, the second semiconductor regions having an impurity concentration higher than an impurity concentration of the second semiconductor layer; a gate electrode provided, via a gate insulating film, on at least one portion of a surface of the second semiconductor layer, between one of the first semiconductor regions and the first semiconductor layer; a first electrode provided on surfaces of the first semiconductor regions and the second semiconductor regions; a second electrode provided on the second main surface of the silicon carbide semiconductor substrate; and a gate pad portion electrically connected to the gate electrode via gate electrode wiring. The gate pad portion is configured by a gate electrode pad and a connecting portion electrically connecting the gate electrode pad and the gate electrode wiring, has, in a region facing the connecting portion in a depth direction, a first region free of the second semiconductor regions, and has, in a region facing a corner portion of the gate electrode pad in the depth direction, a second region free of the second semiconductor regions. A same oxide film as that of the gate insulating film is provided on surfaces of the second semiconductor regions, the first region, and the second region.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques are discussed. In the trench-type MOSFET, the field oxide film 121 is selectively deposited after trench formation. In depositing the field oxide film 121, a problem arises in that a mask has to be formed and manufacturing cost increases. Therefore, a vertical SiC-MOSFET in which the field oxide film 121 is removed has been proposed.

Figure 9:
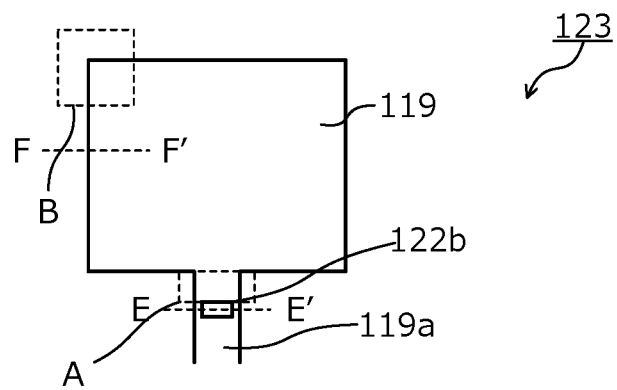
FIG. 9 is a top view of a gate pad portion of a conventional silicon carbide semiconductor device.
Figure 10:
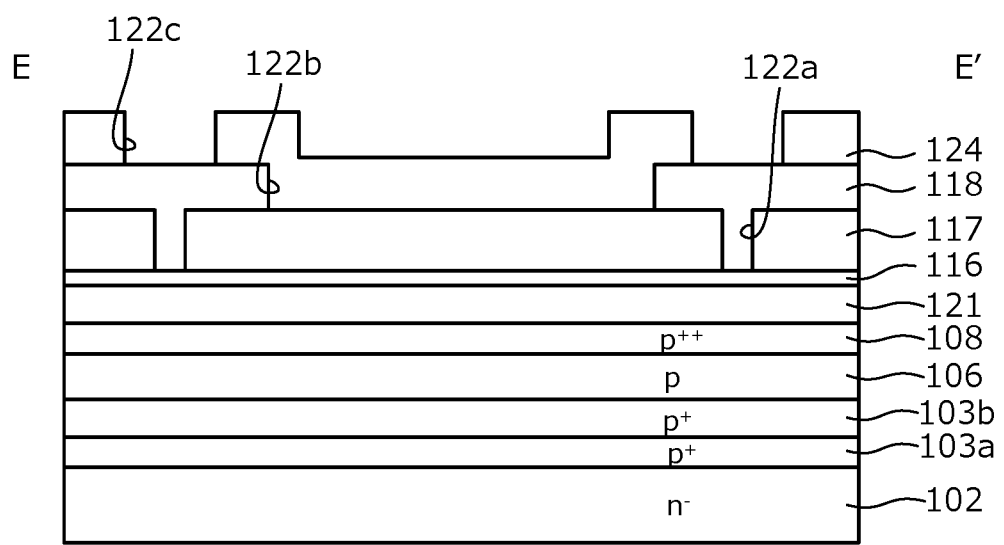
FIG. 10 is a cross-sectional view of a portion E-E' of the conventional silicon carbide semiconductor device depicted in FIG. 9.
Figure 11:
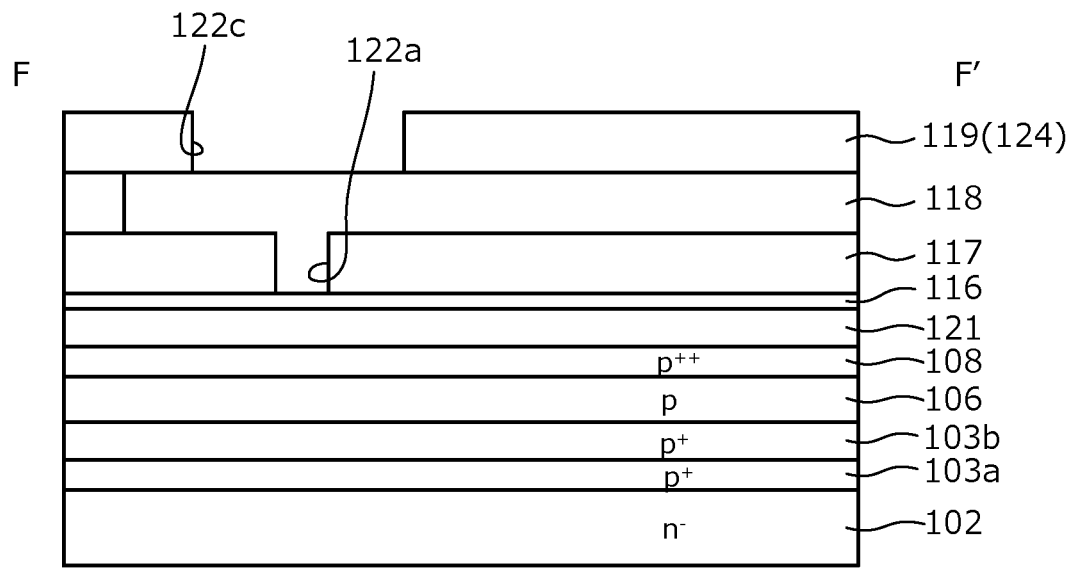
FIG. 11 is a cross-sectional view of a portion F-F' of the conventional silicon carbide semiconductor device depicted in FIG. 9.
Figure 12:
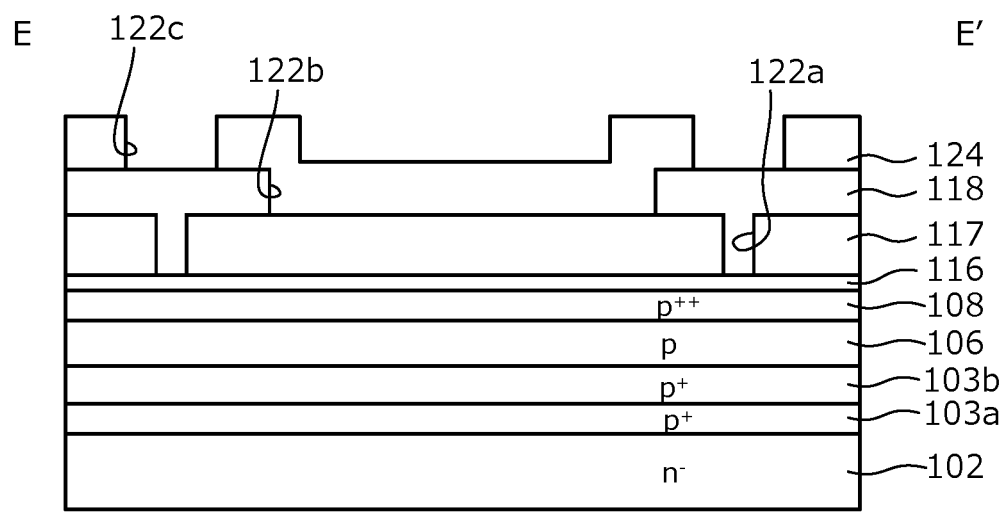
FIG. 12 is a cross-sectional view of the portion E-E' of the silicon carbide semiconductor device depicted in FIG. 9, in which a field oxide film is removed.
Figure 13:
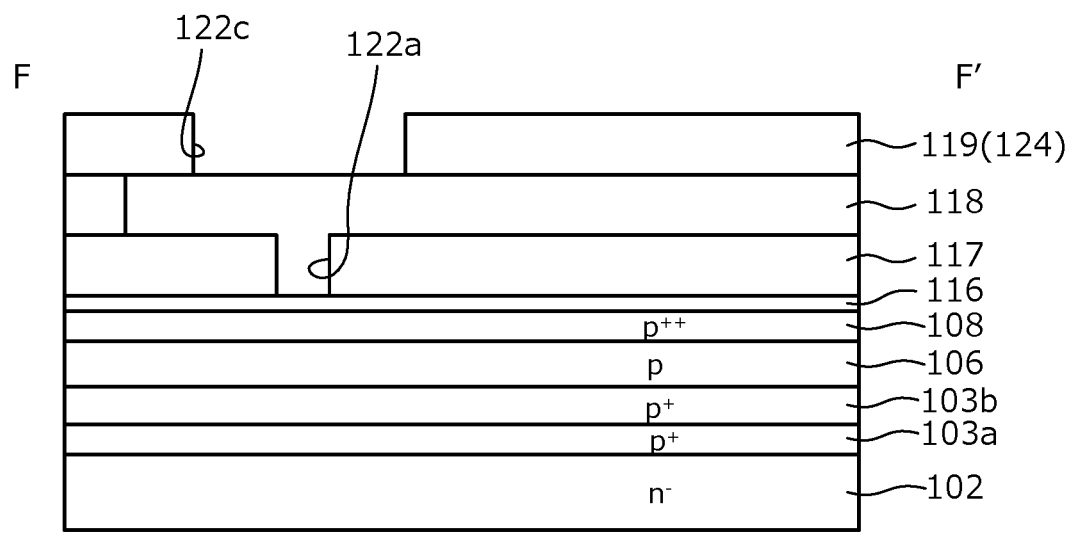
FIG. 13 is a cross-sectional view of the portion F-F' of the silicon carbide semiconductor device depicted in FIG. 9, in which the field oxide film is removed.

FIG. 12 is a cross-sectional view of the portion E-E' of the silicon carbide semiconductor device depicted in FIG. 9, in which the field oxide film is removed. FIG. 13 is a cross-sectional view of the portion F-F' of the silicon carbide semiconductor device depicted in FIG. 9, in which the field oxide film is removed. In this instance, as depicted in FIGS. 12 and 13, the HTO film 116 is provided on the $p^{++}$-type contact region 108.

Nonetheless, a problem arises in that when the field oxide film 121 is not formed, electric field concentration occurs and ESD capability decreases. As a result, when an ESD test is performed on the silicon carbide semiconductor device from which the field oxide film is removed, destruction may occur in the gate electrode pad 119. In particular, destruction may occur in a portion of the connecting portion 119a at the contact hole 122b and a corner portion (portion B in FIG. 9) of the gate electrode pad 119 where electric field concentrates and may occur in a region from the contact hole 122b to the gate electrode pad 119 (portion A in FIG. 9).

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "−" to the index. Further, with consideration of variation in manufacturing, description indicating the same or equal may be within 5%. Further, a same oxide film means oxide films formed concurrently, includes oxide films formed concurrently on surfaces having differing orientations, and corresponds to oxide films formed concurrently and having a thickness corresponding to orientation.

Figure 1:
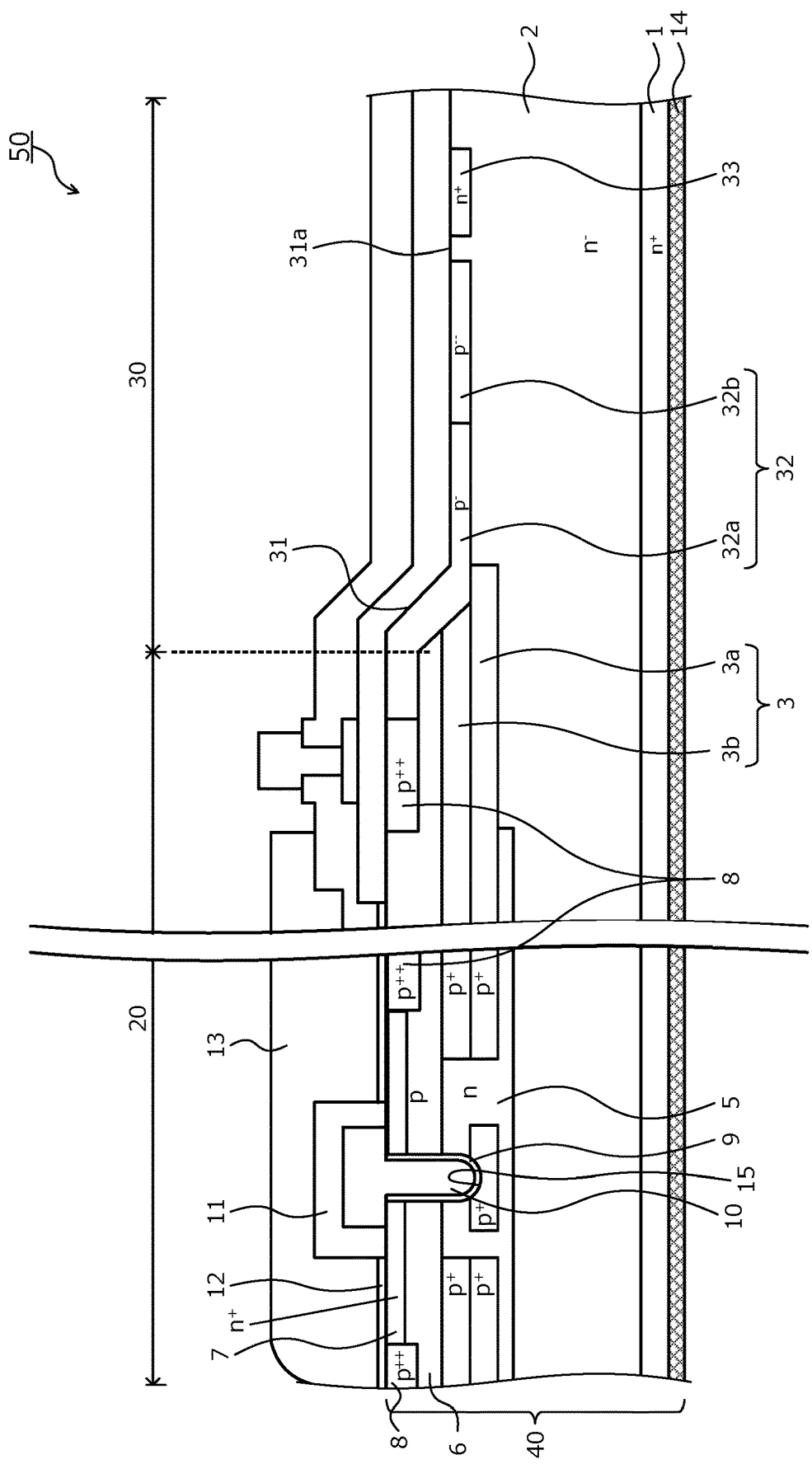
FIG. 1 is a cross-sectional view of a structure of a silicon carbide semiconductor device according to an embodiment.

A semiconductor device according to the present invention contains a wide band gap semiconductor. In an embodiment, a silicon carbide semiconductor device fabricated (manufactured) using, for example, silicon carbide (SiC) as a wide band gap semiconductor is described taking a trench-type MOSFET 50 as an example. FIG. 1 is a cross-sectional view of a structure of the silicon carbide semiconductor device according to the embodiment.

As depicted in FIG. 1, the semiconductor device according to the embodiment has an active region 20 and an edge termination region 30 surrounding a periphery of the active region 20, on a semiconductor base (hereinafter, silicon carbide base (semiconductor substrate (semiconductor chip))) 40 containing silicon carbide. The active region 20 is a region through with current flows in an on-state. The edge termination region 30 is a region that mitigates electric field of a base-front-side of a drift region and sustains a breakdown voltage.

In the silicon carbide base 40, an n$^-$-type semiconductor layer (n$^-$-type silicon carbide layer, first semiconductor layer of a first conductivity type) 2 containing silicon carbide and a p-type semiconductor layer (p-type base layer, second semiconductor layer of a second conductivity type layer) 6 containing silicon carbide are sequentially stacked on a front surface of an n$^+$-type support substrate (n$^+$-type silicon carbide substrate, silicon carbide semiconductor substrate of the first conductivity type) 1 containing silicon carbide. The n$^+$-type silicon carbide substrate 1 functions as a drain region. In the active region 20, p$^+$-type base regions 3 and n-type regions 5 are selectively provided in the n$^-$-type silicon carbide layer 2, at a first surface (base-front-side) thereof opposite to a second surface thereof facing the n$^+$-type silicon carbide substrate 1. Each of the p$^+$-type base regions 3 is configured by two layers including a lower p$^+$-type base region 3a and an upper p$^+$-type base regions 3b.

Further, in the edge termination region 30, a JTE structure 32 is provided in which multiple p$^-$-type low-concentration regions (here, two (2), a p$^-$-type and a p$^{---}$-type indicated by reference characters 32a and 32b, respectively, in a direction from the active region 20 to the edge termination region 30) are disposed adjacent to one another, in descending order of impurity concentration in the direction from the active region 20 to the edge termination region 30. Further, an n$^+$-type semiconductor region 33 that functions as a channel stopper is provided between the JTE structure 32 and an end of the semiconductor chip (chip end). The JTE structure 32 and the n$^+$-type semiconductor region 33 are provided at a bottom 31a of a drop 31 where a thickness of the n$^-$-type silicon carbide layer 2 is relatively thinner due to the drop 31. Of the p$^+$-type base regions 3, an outermost one closest to the chip end extends from the active region 20 to the edge termination region 30. A portion of the n$^-$-type silicon carbide layer 2 other than the p$^+$-type base regions 3 constitutes the drift region. The n-type regions 5 constitute a high-concentration n-type drift layer having an impurity concentration that is lower than that of the n$^+$-type silicon carbide substrate 1 and higher than that of the n$^-$-type silicon carbide layer 2.

On the first surface of the n$^-$-type silicon carbide layer 2 opposite to the second surface thereof facing the n$^+$-type silicon carbide substrate 1, the p-type base layer 6 is provided. The p-type base 6 has an impurity concentration that is lower than an impurity concentration of the p$^+$-type base regions 3. In the p-type base layer 6, n$^+$-type source regions (first semiconductor regions of the first conductivity type) 7 and p$^{++}$-type contact regions (second semiconductor regions of the second conductivity type) 8 are selectively provided.

A portion of the p-type base layer 6 in the active region 20 is provided so as to cover the p$^+$-type base regions 3 and the n-type regions 5. Further, the p-type base layer 6 extends to the edge termination region 30 and in the edge termination region 30, is provided so as to cover the p$^+$-type base regions 3 and the n$^-$-type silicon carbide layer 2 up to the drop 31.

In a portion of the silicon carbide base 40 at the front side thereof in the active region 20, a trench structure is provided. In particular, trenches 15 penetrate through the n$^+$-type source regions 7 and the p-type base layer 6 from a first surface (front side of the silicon carbide base 40) of the p-type base layer 6 opposite to a second surface thereof facing the n$^+$-type silicon carbide substrate 1, and reach the n-type regions 5 and the lower p$^+$-type base regions 3a. Along inner wads of the trenches 15, a gate insulating film 9 is formed along bottoms and sidewalls of the trenches 15 and gate electrodes 10 are formed on the gate insulating film 9 in the trenches 15. The gate electrodes 10 are insulated from the n-type regions 5, the p$^+$-type base regions 3, and the p-type base layer 6 by the gate insulating film 9. A portion of each of the gate electrodes 10 may protrude toward a source electrode pad 13, from a top (side facing the source electrode pad 13) of each of the trenches 15.

An interlayer insulating film 11 is provided in an entire area of the front side of the silicon carbide base 40 so as to cover the gate electrodes 10 embedded in the trenches 15. Source electrodes 12 are in contact with the n$^+$-type source regions 7 and the p$^{++}$-type contact regions 8, via contact holes in the interlayer insulating film 11. The source electrodes 12 are electrically insulated from the gate electrodes 10 by the interlayer insulating film 11. The source electrode pad 13 is provided on the source electrodes 12. On a back surface (back surface of the n$^+$-type silicon carbide substrate 1) of the silicon carbide base 40, a drain electrode 14 is provided.

In FIG. 1, while only one trench MOS structure is depicted, insulated gates constituted by a metal, an oxide film, and a semiconductor (MOS gates) of the trench MOS structure may be further disposed in parallel.

Figure 2:
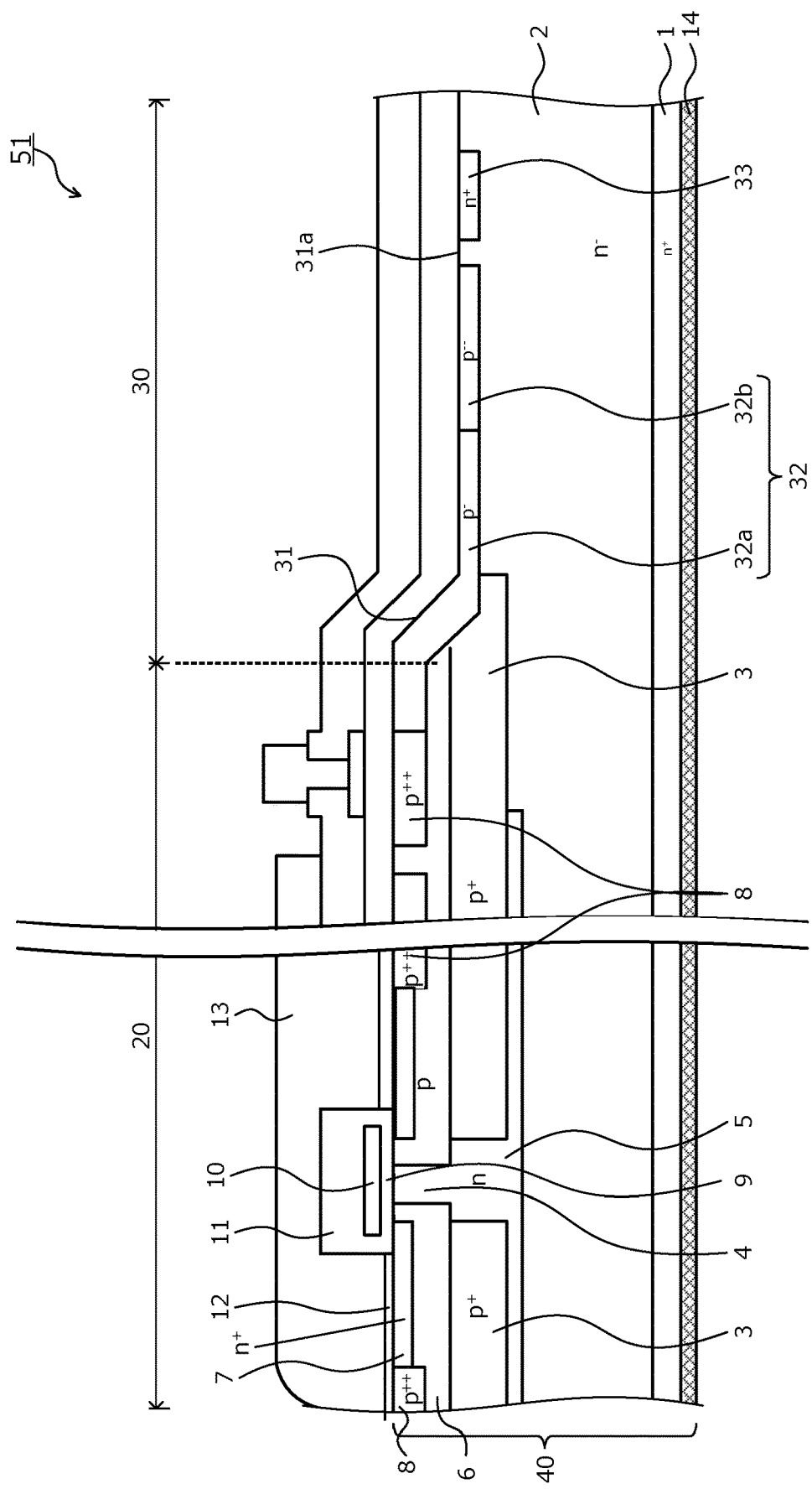
FIG. 2 is a cross-sectional view of another structure of a silicon carbide semiconductor device according to the embodiment.

FIG. 2 is a cross-sectional view of another structure of a silicon carbide semiconductor device according to the embodiment. FIG. 2 depicts an example of a planar MOSFET 51. As depicted in FIG. 2, the semiconductor device according to the embodiment has the active region 20 and the edge termination region 30 surrounding the active region 20, on the silicon carbide base 40 containing silicon carbide.

In the silicon carbide base 40, the n$^-$-type semiconductor layer (n$^-$-type silicon carbide layer) 2 containing silicon carbide and the p-type semiconductor layer (p-type base layer) 6 containing silicon carbide are sequentially stacked on the front surface of the n$^+$-type support substrate (the n$^+$-type silicon carbide substrate) 1 that contains silicon carbide. The n$^+$-type silicon carbide substrate 1 functions as the drain region. In the active region 20, the p$^+$-type base regions 3 and the n-type regions 5 are selectively provided in the n$^-$-type silicon carbide layer 2, at the first surface (base-front-side) thereof opposite to the second surface thereof facing the n$^+$-type silicon carbide substrate 1.

Further, in portions of the p-type base layer 6 on the p$^+$-type base regions 3, the n$^+$-type source regions 7 and p$^{++}$-type contact regions 8 are provided. Further, the n$^+$-type source regions 7 are in contact with the p$^{++}$-type contact regions 8. The p++-type contact regions 8 are disposed closer to the edge termination region 30 than are the n+-type source regions 7.

Further, in a portion of the p-type base layer 6 on one of the n-type regions 5, an n-type well region 4 that penetrates through the p-type base layer 6 in a depth direction and reaches said n-type region 5 is provided. The n-type well region 4 forms the drift region with the n-type regions 5 and the n−-type silicon carbide layer 2. The first semiconductor layer may correspond to the n−-type silicon carbide layer 2, the n-type well region 4 and the n-type regions 5. One of the gate electrodes 10 is provided on the surface of a portion of the p-type base layer 6 between one of the n+-type source regions 7 and the n-type well region 4, via the gate insulating film 9. Said gate electrode 10 may be provided on the surface of the n-type well region 4 via the gate insulating film 9.

The interlayer insulating film 11 is provided in an entire area of the front side of the silicon carbide base 40 so as to cover the gate electrodes 10. The source electrodes 12 are in contact with the n+-type source regions 7 and the p++-type contact regions 8 via contact holes opened in the interlayer insulating film 11. The source electrodes 12 are electrically insulated from the gate electrodes 10 by the interlayer insulating film 11. The source electrode pad 13 is provided on the source electrodes 12. On the back surface (back surface of the n+-type silicon carbide substrate 1) of the silicon carbide base 40, the drain electrode 14 is provided.

In FIG. 2, while only one MOS structure is depicted, insulated gates constituted by a metal, an oxide film, and a semiconductor (MOS gates) of the trench MOS structure may be further disposed in parallel Further, the structure of the edge termination region 30 is the same as that in the trench-type MOSFET and therefore, description thereof is omitted hereinafter.

Figure 3:
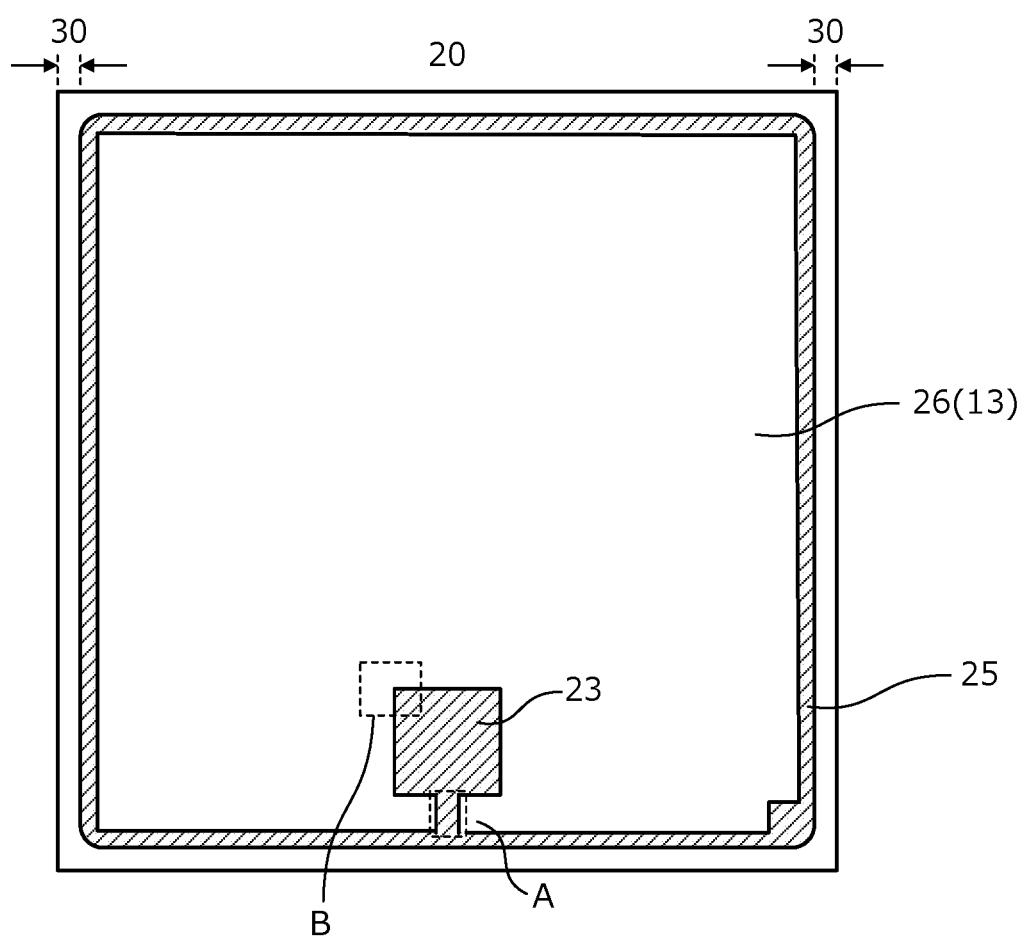
FIG. 3 is a top view of the structure of the silicon carbide semiconductor device according to the embodiment.

Here, FIG. 3 is a top view of the structure of the silicon carbide semiconductor device according to the embodiment. As depicted in FIG. 3, the silicon carbide semiconductor device includes, at a top surface thereof, a source pad portion 26 and a gate pad portion 23. The source electrode pad 13 is provided in the source pad portion 26. The source electrode pad 13 is electrically connected to the source electrodes 12 while the gate pad portion 23 is electrically connected to the gate electrodes 10, via a gate runner (gate electrode wiring) 25.

Figure 4:
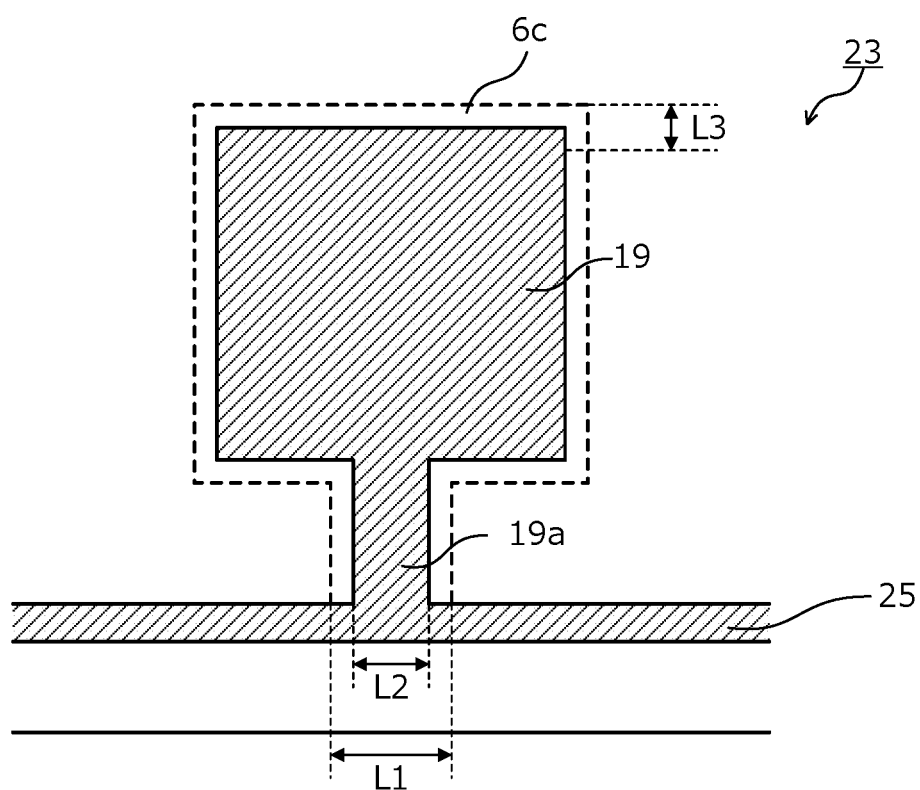
FIG. 4 is an enlarged view of a gate pad portion of the silicon carbide semiconductor device according to the embodiment.

FIG. 4 is an enlarged view of the gate pad portion of the silicon carbide semiconductor device according to the embodiment. As depicted in FIG. 4, the gate pad portion 23 is configured by a gate electrode pad 19 and a connecting portion 19a (portion A in FIG. 3) of the gate electrode pad electrically connecting the gate electrode pad 19 and the gate runner 25. Here, the connecting portion 19a is a region between the gate runner 25 and the gate electrode pad 19, and extends from the gate runner 25 to the gate electrode pad 19. The extending direction of the connection portion 19a may correspond to a first direction.

Figure 5:
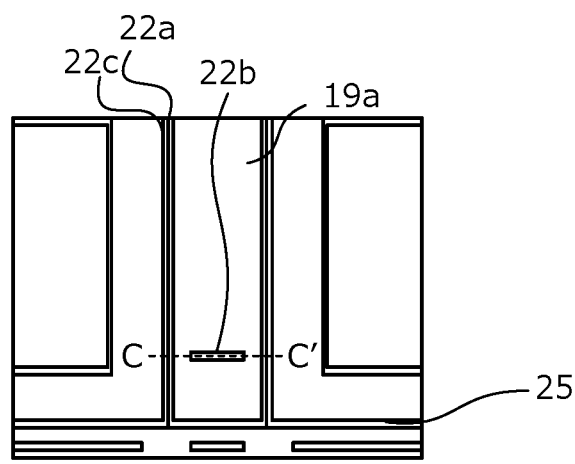
FIG. 5 is an enlarged view of a connecting portion of a gate electrode pad of the silicon carbide semiconductor device according to the embodiment.

FIG. 5 is an enlarged view of the connecting portion of the gate electrode pad of the silicon carbide semiconductor device according to the embodiment. FIG. 5 depicts later-described contact holes 22a, 22b, 22c. However, the contact hole 22a has a narrow width in a second direction orthogonal to the first direction and, thus, is depicted as a single line.

Figure 6:
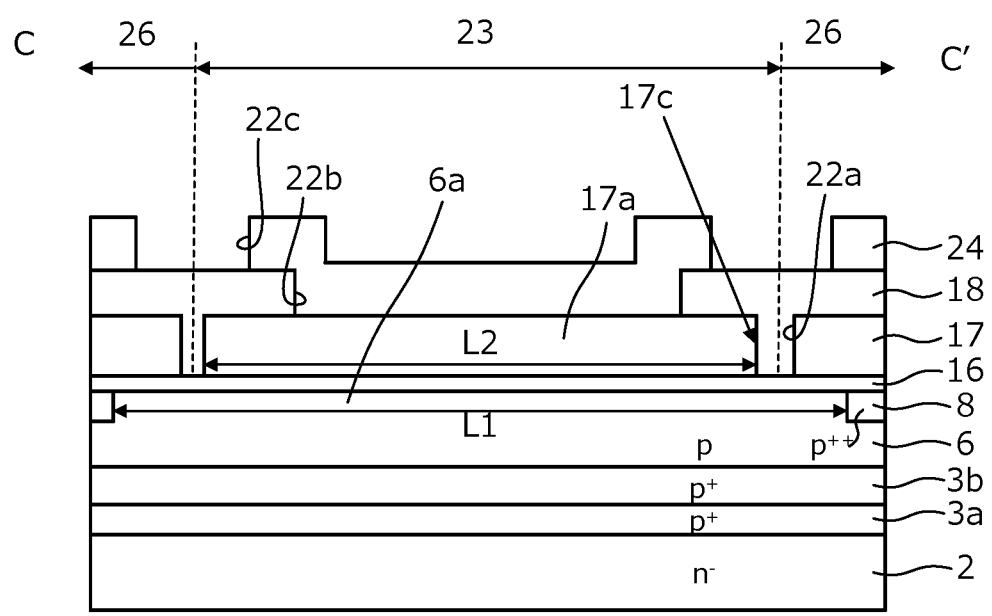
FIG. 6 is a cross-sectional view of a portion C-C' of the silicon carbide semiconductor device according to the embodiment depicted in FIG. 5.

FIG. 6 is a cross-sectional view of a portion C-C' of the silicon carbide semiconductor device according to the embodiment depicted in FIG. 5. In the connecting portion 19a of the gate electrode pad of the silicon carbide semiconductor device according to the embodiment, the n−-type silicon carbide layer 2 and the n-type region (not depicted) are deposited on the front surface of the n+-type silicon carbide substrate, the lower p+-type base regions 3a and the upper p+-type base regions 3b are selectively provided in the n-type region, and the p-type base layer 6 is provided on the n-type region. The lower p+-type base regions 3a and the upper p+-type base regions 3b are provided, whereby displacement current during turn-off easily flows in these regions since resistance is low and concentration of electric field at a later-described HTO film 16 may be suppressed. Further, the p++-type contact regions 8 are selectively provided in the p-type base layer 6, at the surface of the p-type base layer 6. FIG. 6 depicts an instance of the trench-type MOSFET 50 while in the planar MOSFET 51, the p+-type base regions 3 are each constituted by a single layer (refer to FIG. 2). This instance also has the same effects as those of the lower p+-type base regions 3a and the upper p+-type base regions 3b.

On the p++-type contact regions 8 and a later-described first region 6a, the HTO film 16 that is formed concurrently with the gate insulating film 9 and has about a same thickness (in range of 50 nm to 150 nm) as that of the gate insulating film 9 is provided. The gate insulating film 9 and the HTO film 16 that are formed concurrently may be set to be in the range from 50 nm to 150 nm even when respective thicknesses thereof differ due to the plane orientations differing. A polysilicon 17 is provided on the HTO film 16, an interlayer insulating film 18 containing BPSG and NSG is provided on the polysilicon 17, and a metal film 24 is provided on the interlayer insulating film 18. The contact hole 22a that reaches the HTO film 16 is opened in the polysilicon 17 and the interlayer insulating film 18 is embedded in the contact hole 22a. Of the polysilicon 17, a portion thereof facing the source pad portion 26 in a depth direction (direction from the source electrodes 12 to the drain electrode 14) is electrically insulated from the polysilicon (first polysilicon layer) 17a that faces the gate pad portion 23 in the depth direction, by the interlayer insulating film 18.

Further, the contact hole 22b that reaches the polysilicon 17 is opened in the interlayer insulating film 18, whereby the metal film 24 and the polysilicon 17 are electrically connected. The contact hole 22c that reaches the interlayer insulating film 18 is opened in the metal film 24, whereby a portion of the metal film 24 in the gate pad portion 23 and a portion of the metal film 24 in the source pad portion 26 are electrically insulated from each other.

Here, in the embodiment, as depicted in FIG. 6, the HTO film 16, which is thin, is provided on the surfaces of the p-type base layer 6 and the p++-type contact regions 8 without providing the field oxide film. When the field oxide film is omitted, electric field concentration occurs and ESD capability decreases and therefore, a structure that mitigates electric field at a portion where electric field concentration occurs is provided.

The connecting portion 19a of the gate electrode pad portion is one portion where electric field concentration occurs. Therefore, the silicon carbide base 40 has, in a region facing the connecting portion 19a in the depth direction, the first region 6a in which the p++-type contact regions 8 are omitted to, thereby, be free of the p++-type contact regions 8. Therefore, in the connecting portion 19a, the HTO film 16 is in contact with the p-type base layer 6 in the depth direction. For this structure, for example, the first region 6a having a width in the second direction that is at least a width L2 of the polysilicon 17a of the connecting portion 19a may be set as the p-type base layer 6 free of the formation of the p++-type contact regions 8. Preferably, a width L1 in the second direction of the first region 6a may be equal to the width L2 of the polysilicon 17a (for example, 80 µm) or may extend at most 20 µm beyond an end 17c of the polysilicon 17a. Therefore, preferably, the width L1 of the first region 6a may be in a range of 80 µm to 120 µm. When greater than 120 µm, regions of low resistance increase and when displacement current flows during turn-off, the HTO film 16 may be destroyed. Further, when less than the width L2 of the polysilicon 17a, depletion layer width decreases and ESD capability may not be sufficiently increased.

The first region 6a has an impurity concentration that is lower than that of the $p^{++}$-type contact regions 8. The lower is the impurity concentration, the greater is the depletion layer width and therefore, ESD capability is increased by the first region 6a and an ESD capability about equal to that in an instance in which the field oxide film is provided may be realized. In this manner, in the embodiment, ESD capability is maintained, and manufacturing cost may be reduced without providing the field oxide film.

Figure 7:
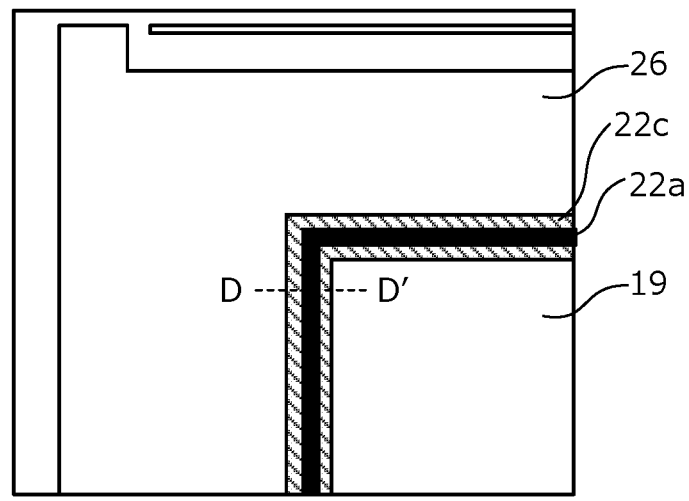
FIG. 7 is an enlarged view of a corner portion of the gate electrode pad of the silicon carbide semiconductor device according to the embodiment.

FIG. 7 is an enlarged view of a corner portion of the gate electrode pad of the silicon carbide semiconductor device according to the embodiment. The corner portion of the gate electrode pad is a portion of one of four corners of the gate electrode pad (portion B in FIG. 3). In FIG. 7, the contact holes 22a, 22c are depicted. However, the contact hole 22a has a narrow width and therefore, is depicted as a single line.

Figure 8:
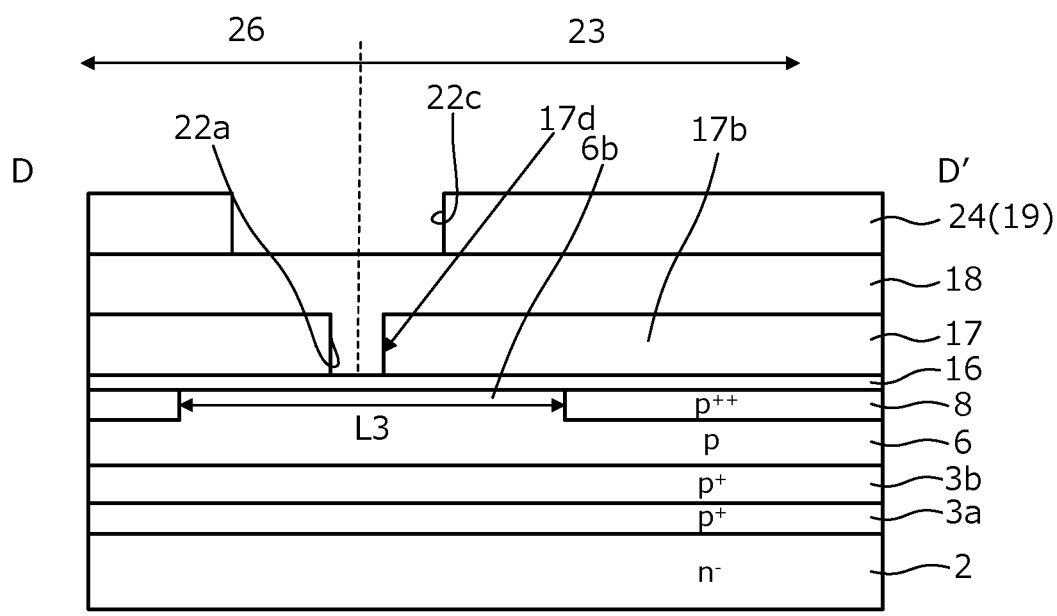
FIG. 8 is a cross-sectional view of a portion D-D' of the silicon carbide semiconductor device according to the embodiment in FIG. 7.

FIG. 8 is a cross-sectional view of a portion D-D' of the silicon carbide semiconductor device according to the embodiment in FIG. 7. In the corner portion of the gate electrode pad of the silicon carbide semiconductor device according to the embodiment, similarly to the connecting portion 19a, the $n^-$-type silicon carbide layer 2 and the n-type region (not depicted) are deposited on the $n^+$-type silicon carbide substrate, the lower $p^+$-type base regions 3a and the upper $p^+$-type base regions 3b are selectively provided in the n-type region, and the p-type base layer 6 is provided on the n-type region. Further, the $p^{++}$-type contact regions 8 are selectively provided in the p-type base layer 6, at the surface of the p-type base layer 6. FIG. 8 depicts an instance of the trench-type MOSFET 50 while in the planar MOSFET 51, the $p^+$-type base regions 3 are constituted by a single layer (refer to FIG. 2).

The HTO film 16 is provided on the $p^{++}$-type contact regions 8 and a later-described second region 6b. The polysilicon 17 is provided on the HTO film 16, the interlayer insulating film 18 containing BPSG and NSG is provided on the polysilicon 17, and the metal film 24 is provided on the interlayer insulating film 18. The contact hole 22a that reaches the HTO film 16 is provided in the polysilicon 17 and the interlayer insulating film 18 is embedded in the contact hole 22a. Of the polysilicon 17, a portion thereof facing the source pad portion 26 in the depth direction is electrically insulated from the polysilicon (second polysilicon layer) 17b facing the gate pad portion 23 in the depth direction, by the interlayer insulating film 18.

Further, the contact hole 22c that reaches the interlayer insulating film 18 is opened in the metal film 24, whereby the portion of the metal film 24 in the gate pad portion 23 and the portion of the metal film 24 in the source pad portion 26 are electrically insulated from each other. The portion of the metal film 24 in the gate pad portion 23 constitutes the gate electrode pad 19.

The corner portions of the gate electrode pad are portions where electric field concentration occurs. Therefore, the silicon carbide base 40 has, in a region facing a corner portion in the depth direction, the second region 6b in which the $p^{++}$-type contact regions 8 are omitted to, thereby, be free of the $p^{++}$-type contact regions 8. Therefore, in the corner portions of the gate electrode pad, the HTO film 16 is in contact with the p-type base layer 6 in the depth direction. For this structure, for example, a region in the p-type base layer 6 with an end 17d of the polysilicon 17b of the gate electrode pad 19 as a center and without forming the $p^{++}$-type contact regions 8 can be the second region 6b. Preferably, a length L3 of the second region 6b of the corner portion of the gate electrode pad may be in a range from 10 µm to 40 µm with the end 17d of the polysilicon 17b as the center. In this instance as well, when greater than 40 µm, regions of low resistance increase and when displacement current flows during turn-off, the HTO film 16 may be destroyed. Further, when less than 10 µm, the depletion layer width decreases and ESD capability may not be sufficiently increased.

In the gate electrode pad 19, other than the corner portions, there may be regions in which the $p^{++}$-type contact regions 8 are omitted to, thereby, be free of the $p^{++}$-type contact regions 8. For example, as depicted in FIG. 4, in an entire region of an outer periphery of the gate electrode pad 19, the $p^{++}$-type contact regions 8 may be omitted, thereby providing a third region 6c free of the $p^{++}$-type contact regions 8. In this instance as well, for example, a region in the p-type base layer 6 with the end 17d of the polysilicon 17b of the gate electrode pad 19 as a center and without forming the $p^{++}$-type contact regions 8 can be the third region Sc. Preferably, the length L3 of the third region 6c in the outer periphery of the gate electrode pad may be in a range from 10 µm to 40 µm with the end 17d of the polysilicon 17b as the center.

The second region 6b and the third region 6c have an impurity concentration that is lower than that of the $p^{++}$-type contact regions 8. The lower is the impurity concentration, the wider is the depletion layer width and therefore, the ESD capability is increased and an ESD capability that is about the same as that in an instance in which the field oxide film is provided is realized by the second region 6b and the third region 6c. In this manner, in the embodiment, the ESD capability is maintained, and manufacturing cost may be reduced without providing the field oxide film.

A method of manufacturing the silicon carbide semiconductor device according to the embodiment may be the following method. Here, an instance in which a trench-type MOSFET having a 1200V breakdown voltage is fabricated is described as an example. First, the $n^+$-type silicon carbide substrate (semiconductor wafer) 1 containing single crystal silicon carbide is prepared doped with an n-type impurity (dopant) such as nitrogen(N) so that the impurity concentration becomes, for example, $2.0 \times 10^{19}/cm^3$. The front surface of the $n^+$-type silicon carbide substrate 1 may be, for example, a (0001) plane having an off-angle of about 4 degrees in the <11-20> direction. Next, on the front surface of the $n^+$-type silicon carbide substrate 1, the $n^-$-type silicon carbide layer 2 doped with an n-type impurity such as nitrogen to have an impurity concentration of, for example, $1.0 \times 10^{16}/cm^3$ is epitaxially grown to have a thickness of, for example, 10 µm.

Next, the n-type regions 5 are selectively formed in the $n^-$-type silicon carbide layer 2 at the surface thereof by photolithography and ion implantation. In the ion implantation, an n-type impurity (dopant) such as nitrogen may be implanted so that the concentration thereof becomes, for example, $1 \times 10^{17}/cm^3$.

Next, the $p^+$-type base regions 3 are selectively formed in the n-type regions 5, at surfaces thereof by photolithography and ion implantation. Of the $p^+$-type base regions 3, an outermost one closest to the chip end is formed so as to extend into the edge termination region 30. In the ion implantation, for example, a p-type impurity (dopant) such as aluminum (Al) may be implanted so that the impurity concentration of the $p^+$-type base regions 3 becomes $5.0 \times 10^{16}/cm^3$.

Next, the p-type base layer 6 doped with a p-type impurity such as aluminum so that the impurity concentration becomes, for example, $2.0 \times 10^{17}/cm^3$ is epitaxially grown on the surface of the $n^-$-type silicon carbide layer 2 to have a thickness of, for example, 1.3 μm.

By the processes up to here, the silicon carbide base 40 in which the $n^-$-type silicon carbide layer 2 and the p-type base layer 6 are sequentially stacked on the front surface of the $n^+$-type silicon carbide substrate 1 is fabricated. Next, a process that includes formation of an ion implantation mask by photolithography and etching, ion implantation using the ion implantation mask, and removal of the ion implantation mask as one set is repeatedly performed under different conditions, whereby the $n^+$-type source regions 7 and the $p^{++}$-type contact regions 8 are formed in the p-type base layer 6 at the surface thereof. At this time, the $p^{++}$-type contact regions 8 are not formed in the first region 6a, the second region 6b, or the third region 6c described above. That is, the first region 6a, the second region 6b, and the third region 6c can be respectively formed by regions in the p-type base layer 6 that are free of the $p^{++}$-type contact regions 8.

Next, a drop 31 is formed at the surface of the p-type base layer 6 in the edge termination region 30 by photolithography and etching so to have a depth of 1.5 μm from the surface of the p-type base layer 6, for example, and the p-type base layer 6 and the $n^-$-type silicon carbide layer 2 are partially removed, thereby, exposing the $n^-$-type silicon carbide layer 2. Next, a JTE structure 32 is selectively formed by photolithography and ion implantation. Next, the $n^+$-type semiconductor region 33 is selectively formed by photolithography and ion implantation.

Next, a heat treatment (annealing) is performed, thereby activating, for example, the $p^+$-type base regions 3, the $n^+$-type source regions 7, the $p^{++}$-type contact regions 8, the JTE structure 32, and the $n^+$-type semiconductor region 33. A temperature of the heat treatment may be, for example, about 1700 degrees C. A period of the heat treatment may be, for example, about 2 minutes. As described above, all ion-implanted regions may be activated collectively by a single session of the heat treatment or may be activated by performing the heat treatment each time the ion implantation is performed.

Next, on the surface of the p-type base layer 6 (i.e., surfaces of the $n^+$-type source regions 7 and the $p^{++}$-type contact regions 8), trenches 15 that penetrate through the $n^+$-type source regions 7 and the p-type base layer 6 and reach the n-type regions 5 are formed by photolithography and etching. Bottoms of the trenches 15 reach the $p^+$-type base regions 3.

Next, along the surfaces of the $n^+$-type source regions 7 and the $p^{++}$-type contact regions 8 and along the bottoms and sidewalls of the trenches 15, the gate insulating film 9 is formed. The gate insulating film 9 is formed by a deposition method by a chemical reaction such as that for a high temperature oxide (HTO). The gate insulating film 9 formed on the surfaces of the $p^{++}$-type contact regions 8 constitutes the HTO film 16 depicted in FIGS. 6 and 8.

Next, a polycrystalline silicon layer doped with, for example, phosphorus (P) atoms is formed on the gate insulating film 9. The polycrystalline silicon layer is formed so as to be embedded in the trenches 15. The polycrystalline silicon layer is patterned and left in the trenches 15, thereby forming the gate electrodes 10. A portion of each of the gate electrodes 10 may protrude toward the source electrode pad 13 from a top (side facing the source electrode pad 13) of each of the trenches 15.

Next, for example, a phosphosilicate glass (PSG) is deposited so as to cover the gate insulating film 9 and the gate electrodes 10 and have a thickness of about 1 μm, whereby the interlayer insulating film 11 is formed. The interlayer insulating film 11 and the gate insulating film 9 are patterned and selectively removed, whereby contact holes are formed, thereby exposing the $n^+$-type source regions 7 and the $p^{++}$-type contact regions 8. Thereafter, a heat treatment (reflow) is performed, thereby planarizing the interlayer insulating film 11.

Subsequently, a conductive film constituting the source electrodes 12 is formed in the contact holes and on the interlayer insulating film 11. The conductive film is selectively removed and, for example, is left only in the contact holes as the source electrodes 12.

Subsequently, the drain electrode 14 constituted by, for example, a nickel (Ni) film is formed on the back surface (back surface of the $n^+$-type silicon carbide substrate 1) of the silicon carbide base 40. Thereafter, a heat treatment is performed at a temperature of, for example, about 970 degrees, whereby the $n^+$-type silicon carbide substrate 1 and the drain electrode 14 are in ohmic contact.

Next, for example, an aluminum film is provided, for example, by sputtering, so as to cover the source electrodes 12 and the interlayer insulating film 11 and have a thickness of, for example, about 5 μm. Thereafter, the aluminum film is selectively removed so as to be left covering the active region 20, whereby the source electrode pad 13 is formed.

Next, for example, titanium (Ti), nickel (Ni), and gold (Au) are sequentially stacked on the surface of the drain electrode 14, whereby a drain electrode pad is formed. As described above, the trench-type MOSFET 50 depicted in FIG. 1 is completed. The planar MOSFET 51 depicted in FIG. 2 may also be formed by a similar method.

As described above, according to the embodiment, without providing the field oxide film, a region in which the $p^{++}$-type contact regions are omitted is provided in the connecting portion of the gate pad portion and the corner portions of the gate electrode pad. Therefore, in the connecting portion and the corner portions, the HTO film is in contact with the p-type base layer, in the depth direction. The p-type base layer has an impurity concentration that is lower than that of the $p^{++}$-type contact regions and the lower is the impurity concentration, the wider is the depletion layer width and therefore, the ESD capability is increased by the p-type base layer and an ESD capability about equal to that in an instance in which the field oxide film is provided may be realized. In this manner, in the embodiment, the ESD capability is maintained and without providing the field oxide film, manufacturing cost may be reduced.

In the foregoing, the present invention may be variously modified within a range not departing from the spirit of the invention and in the embodiments described above, for example, dimensions, impurity concentrations, etc. of parts are variously set according to necessary specifications. Further, in the present invention, while a first conductivity type is assumed to be a p-type and a second conductivity type is assumed to be an n-type in the embodiments, the present invention is similarly implemented when the first conductivity type is an n-type and the second conductivity type is a p-type.

According to the invention described above, without providing the field oxide film, a region in which the $p^{++}$-type contact regions (second semiconductor regions of the second conductivity type) are omitted is provided in the connecting portion of the gate pad portion and the corner portions of the gate electrode pad. Therefore, in the connecting portion and the corner portions, the HTO film is in contact with the p-type base layer(second semiconductor layer of a second conductivity type), in the depth direction. The p-type base layer has an impurity concentration that is lower than that of the $p^{++}$-type contact regions and the lower is the impurity concentration, the wider is the depletion layer width and therefore, the ESD capability is increased by the p-type base layer and an ESD capability about equal to that in an instance in which the field oxide film is provided may be realized. In this manner, in the present invention, the ESD capability is maintained and without providing the field oxide film, manufacturing cost may be reduced.

The silicon carbide semiconductor device according to the present invention achieves an effect in that even when the field oxide film is removed, the ESD capability may be maintained.

As described above, the silicon carbide semiconductor device according to the present invention is useful for power semiconductor devices used in power converting equipment of inverters, etc., power source devices such as those of various types of industrial machines, inverters of automobiles, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate of a first conductivity type, having a first main surface and a second main surface opposite to each other;
   a first semiconductor layer of the first conductivity type, provided on the first main surface of the silicon carbide semiconductor substrate, the first semiconductor layer having an impurity concentration lower than an impurity concentration of the silicon carbide semiconductor substrate and a first surface and a second surface that are opposite to each other, the second surface facing the silicon carbide semiconductor substrate;
   a second semiconductor layer of a second conductivity type, selectively provided in the first semiconductor layer, at the first surface of the first semiconductor layer, the second semiconductor layer having a first surface and a second surface opposite to each other, the second surface facing the silicon carbide semiconductor substrate;
   a plurality of first semiconductor regions of the first conductivity type, selectively provided in the second semiconductor layer, at the first surface of the second semiconductor layer;
   a plurality of second semiconductor regions of the second conductivity type, selectively provided in the second semiconductor layer at the first surface of the second semiconductor layer, the second semiconductor regions having an impurity concentration higher than an impurity concentration of the second semiconductor layer;
   a gate insulating film on at least a portion of a surface of the second semiconductor layer, between one of the first semiconductor regions and the first semiconductor layer;
   a gate electrode provided on the gate insulating film;
   a first electrode provided on surfaces of the first semiconductor regions and the second semiconductor regions;
   a second electrode provided on the second main surface of the silicon carbide semiconductor substrate;
   gate electrode wiring connected to the gate electrode;
   a gate pad portion electrically connected to the gate electrode via the gate electrode wiring; and
   an oxide film provided under the gate pad portion, wherein
   the gate pad portion is configured by a gate electrode pad and a connecting portion electrically connecting the gate electrode pad and the gate electrode via the gate electrode wiring,
   the second semiconductor layer includes
       a first region facing the connecting portion in a depth direction, and being free of the second semiconductor regions, and
       a second region facing a corner portion of the gate electrode pad in the depth direction, and being free of the second semiconductor regions,
   the oxide film is provided on surfaces of the second semiconductor regions, the first region, and the second region, and
   the oxide film and the gate insulating film are made of a same material.

2. The silicon carbide semiconductor device according to claim 1, further comprising a first polysilicon layer provided on the oxide film in the first region, wherein
   the connection portion extends from the gate electrode wiring to the gate electrode pad in a first direction, and
   the first polysilicon layer has a width in a second direction orthogonal to the first direction equal to or less than a width of the first region.

3. The silicon carbide semiconductor device according to claim 2, wherein the width of the first region is greater than the width of the first polysilicon layer in the second direction, so that each end of the first region in the second direction is located at least 20 μm away from each end of the first polysilicon layer.

4. The silicon carbide semiconductor device according to claim 1, further comprising a second polysilicon layer provided below the gate electrode pad in the depth direction, wherein
   a width of the second region in the second direction is in a range from 10 μm to 40 μm with an end of a second polysilicon layer as a center.

5. The silicon carbide semiconductor device according to claim 1, wherein the first region and the second region are each of the second conductivity type, and have an impurity concentration that is the same as an impurity concentration of the second semiconductor layer.

6. The silicon carbide semiconductor device according to claim 1, wherein the second semiconductor layer further includes a third region that is free of the second semiconductor regions, and is provided at a periphery of the gate electrode pad, and
   the oxide film is further provided on a surface of the third region.

7. The silicon carbide semiconductor device according to claim 1, wherein a thickness of the oxide film is in a range from 50 nm to 150 nm.

* * * * *